(12) United States Patent
Groenendaal et al.

(10) Patent No.: US 9,275,980 B2
(45) Date of Patent: Mar. 1, 2016

(54) METHOD FOR EMBEDDING A LED NETWORK

(75) Inventors: Bert Groenendaal, Knesselare (BE); Joost Wille, Loppem (BE)

(73) Assignee: SIOEN INDUSTRIES, Ardooie (BE)

( * ) Notice: Subject to any disclaimer, the term of this patent is extended or adjusted under 35 U.S.C. 154(b) by 23 days.

(21) Appl. No.: 13/979,604

(22) PCT Filed: Jan. 12, 2012

(86) PCT No.: PCT/IB2012/050162
§ 371 (c)(1),
(2), (4) Date: Dec. 18, 2013

(87) PCT Pub. No.: WO2012/095812
PCT Pub. Date: Jul. 19, 2012

(65) Prior Publication Data
US 2014/0092598 A1  Apr. 3, 2014

(30) Foreign Application Priority Data

Jan. 12, 2011  (BE) .................................. 2011/0011

(51) Int. Cl.
*H01L 33/52* (2010.01)
*H01L 33/56* (2010.01)
*H01L 21/50* (2006.01)
(Continued)

(52) U.S. Cl.
CPC ............ *H01L 25/0753* (2013.01); *B32B 37/24* (2013.01); *F21S 4/002* (2013.01); *H01L 33/005* (2013.01); *H01L 33/52* (2013.01); *B32B 2037/243* (2013.01); *B32B 2038/0076* (2013.01); *B32B 2305/34* (2013.01); *B32B 2457/00* (2013.01); *F21Y 2101/02* (2013.01); *F21Y 2105/001* (2013.01); *H01L 33/56* (2013.01); *H01L 2924/0002* (2013.01); *H01L 2933/005* (2013.01); *Y10T 29/4913* (2015.01)

(58) Field of Classification Search
CPC ........ H01L 33/52; H01L 33/56; H01L 33/005
See application file for complete search history.

(56) References Cited

U.S. PATENT DOCUMENTS

2004/0187917 A1   9/2004 Pichler
2007/0105250 A1   5/2007 Daniels et al.
(Continued)

FOREIGN PATENT DOCUMENTS

DE   102006046961   4/2008
DE   102007039416   2/2009
(Continued)

OTHER PUBLICATIONS

Dow Corning, "Information about Dow Corning® brand Silicone Encapsulants", Jan. 2005, Dow Corning Corporation, Form 10-898F-01, 8 pages.*

(Continued)

*Primary Examiner* — Evan Pert
(74) *Attorney, Agent, or Firm* — Sughrue Mion, PLLC

(57) ABSTRACT

The invention relates to a method for embedding a non-embedded or bare LED network. To this end, the method of embedding a non-embedded LED network comprises the steps of: •(a) providing said non-embedded LED network associated with a continuous flexible support; •(b) applying in a continuous manner a flexible insulation layer on a liquid basis onto said non-embedded LED network associated with said continuous flexible support.

18 Claims, 2 Drawing Sheets

(51) Int. Cl.
*H01L 25/075* (2006.01)
*H01L 33/00* (2010.01)
*B32B 37/24* (2006.01)
*F21S 4/00* (2006.01)
*B32B 38/00* (2006.01)
*F21Y 101/02* (2006.01)
*F21Y 105/00* (2006.01)

(56) References Cited

U.S. PATENT DOCUMENTS

2007/0216274 A1   9/2007   Schultz et al.
2008/0137332 A1*  6/2008   Lo et al. .................. 362/240
2008/0295327 A1   12/2008  Aeling et al.
2009/0020779 A1   1/2009   Yamada et al.

FOREIGN PATENT DOCUMENTS

EP   1814151      8/2007
WO   2007149362   12/2007

OTHER PUBLICATIONS

International Search Report and Written Opinion dated Jul. 10, 2012, for International Patent Application No. PCT/IB2012/050162, Applicant, Sioen Industries (11 pages).

* cited by examiner

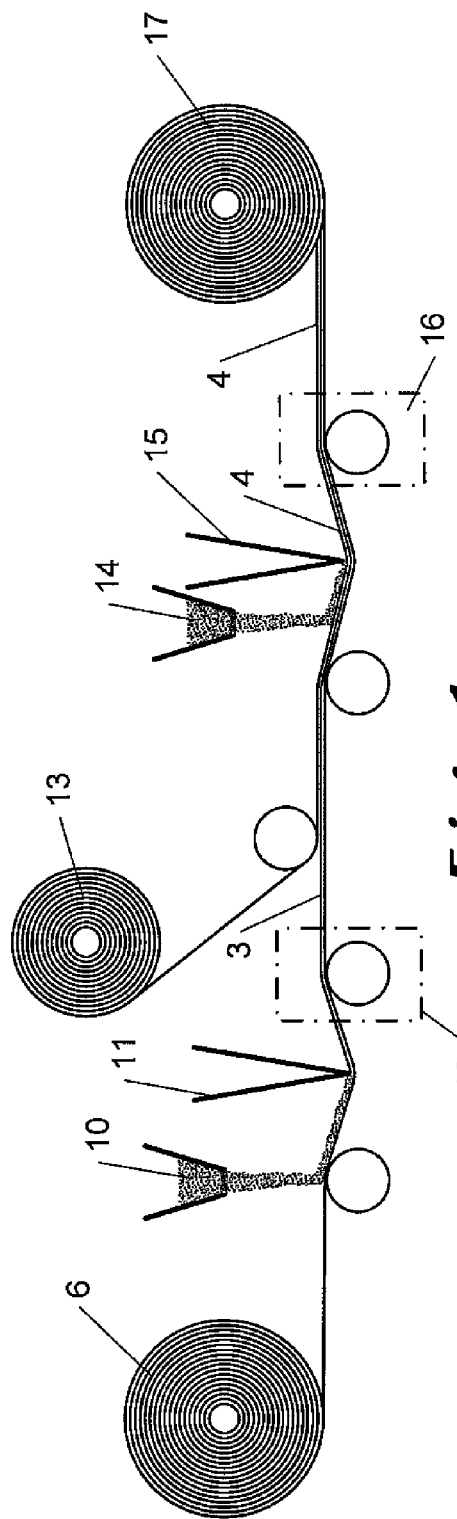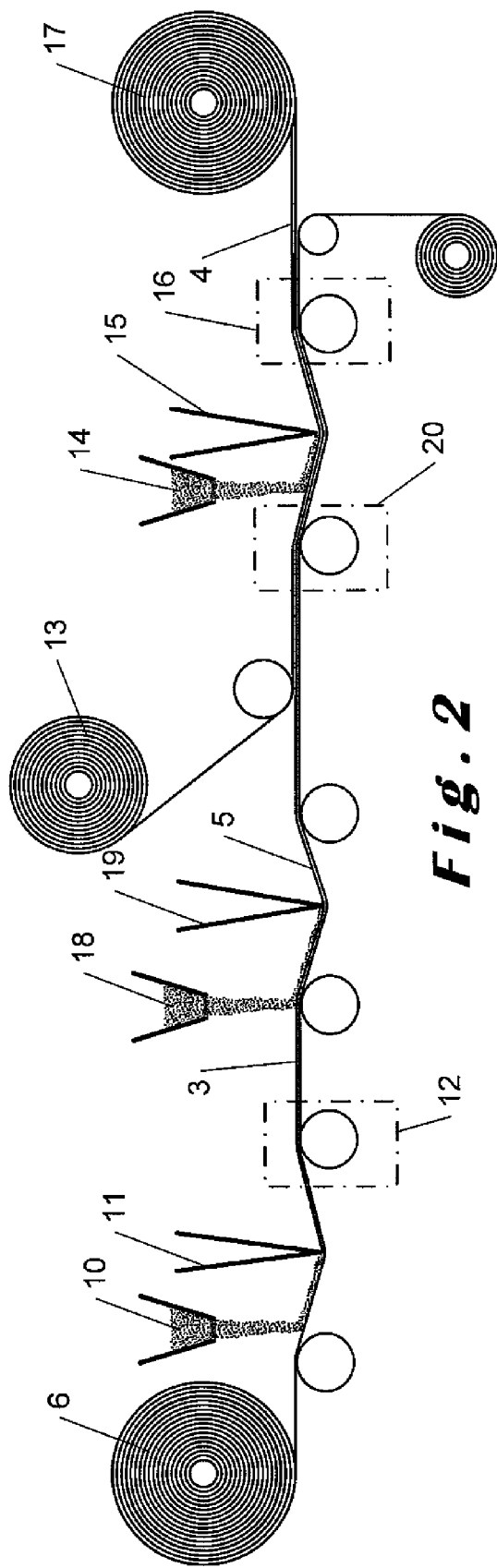

METHOD FOR EMBEDDING A LED NETWORK

INTRODUCTION

The invention relates to a method for embedding a non-embedded or bare LED network.

A LED network comprises a network of conductors which are able to provide a set of LEDs (LED=light emitting diode) with energy and which connect said set of LEDs to one another in a pattern (an electrical circuit). This pattern may be a one-dimensional matrix, but will be in most cases a two-dimensional matrix. Also, this pattern may be formed by a set of LEDs that are positioned in a plane in an irregular manner. Typically, a LED network is connected to a power supply, with or without a controller element between the power supply and the LED network, in order to light up the LEDs in the network.

A LED network is typically manufactured on a printed circuit board. Herein, the conductors are provided as conductive strips in or on the printed circuit board and the LEDs are attached onto the printed circuit board, for example, by soldering. With such a LED network on a printed circuit board, there are two possibilities to finish the whole into an end product. Either embedded LEDs are mounted onto the printed circuit board, such that directly an end product (i.e. an embedded LED network) is obtained. Or non-embedded LEDs (or bare LEDs) are attached onto the printed circuit board, after which the printed circuit board is provided with an insulation layer such that both the LEDs and the conductive strips are embedded and an embedded LED network is obtained. A combination of the above methods is an additional possibility.

A disadvantage of a LED network on a printed circuit board is that a printed circuit board is formed as an individual piece. Therefore, the production process of such a LED network is a step-by-step process and therefore complex. Therefore, also the dimensions are limited in size, and for each LED network with different dimensions, an individual printed circuit board will need to be designed.

Because the aforementioned disadvantages are known, further LED networks have been developed that are not formed on a printed circuit board, but wherein the conductors are formed as individual parts. Such LED networks are typically formed by connecting encapsulated conductors with embedded LEDs, thus creating an "embedded" network of LEDs. Such LED networks are often used in Christmas lighting. The advantage of such LED networks is that they may be manufactured as a continuous band and that this will allow the easy manufacturing of LED networks with larger and/or more various dimensions. A disadvantage of such LED networks is the cost price, namely, encapsulated conductors are markedly more expensive than bare conductors. Also, embedded LEDs are more expensive than bare LEDs. A further disadvantage of such LED networks is that they are relatively thick, such that the application possibilities are limited. This thickness is a consequence of the dimensions of an encapsulated LED which is often a few millimetres thick, in contrast to the dimensions of a bare LED which is only a few tenths of a millimetre thick. Furthermore, the production process is complex because the encapsulated conductors at the location of the connection with the conductors need to be stripped in order to obtain an electrical connection.

Furthermore, also LED networks in a flexible form have been developed.

U.S. Pat. No. 2007/0105250 and WO 2007/149362 (Articulated Technologies LLC, 2007) describe a flexible embedded LED network and a process for the manufacture of such an embedded LED network wherein bare LED-units, embedded in a melt adhesive layer, are laminated between two substrates with conductive surfaces by feeding the laminate through a press roll device, wherein the melt adhesive layer is melted, and the two conductive surfaces make contact with the respective n and p side of the LEDs, and the two substrates are bound to each other, and at the same time isolate the conductive surfaces.

DE 10 2007 039 416 A1 (Airbus Deutschland GmbH, 2009) discloses a flexible embedded LED network comprising two non-conductive plastics layers and an intermediate layer comprising a bare LED network, manufactured by laminating said layers in a press roll device. Said publication does not describe an embedded LED network on a support. A disadvantage of this process is the inclusion of moisture and oxygen from the air, which corrodes the bare LEDs and conductors, and thus reduces its reliability. Another disadvantage is that the pressure exerted by the press roll device on the LEDs may damage or loosen the LEDs from the conductors.

DESCRIPTION OF THE INVENTION

It is an object of the invention to manufacture an embedded LED network in a simpler, faster and more reliable manner.

To this end, the method for embedding a non-embedded LED network according to the invention is characterized by comprising the following steps:

(a) providing said non-embedded LED network associated with a continuous flexible support;

(b) applying in a continuous manner a flexible insulation layer on a liquid basis onto said non-embedded LED network associated with said continuous flexible support.

Optionally, the method according to the invention comprises the step of winding, folding, cutting and/or stacking the product that is at least obtained with the steps (a) and (b). Hence, this product shall include at least said non-embedded LED network associated with a continuous flexible support and a flexible insulation layer on a liquid basis, applied onto said non-embedded LED network associated with said continuous flexible support. Preferably, the flexible insulation layer is also a continuous flexible insulation layer.

By applying a flexible insulation layer on a liquid basis, the encapsulation of moisture and oxygen from the air will be avoided, which increases the reliability, and a flexible layer may be applied both on the basis of a thermoplastic as a non-thermoplastic material. By carrying out the method in a continuous manner, a large amount of the embedded LED network may rapidly be obtained. By providing said non-embedded LED network associated with a continuous flexible support, the method can be carried out continuously, for example via a continuous method (roll-to-roll), wherein the product is wound up on a reel or roll.

DETAILED DESCRIPTION OF THE INVENTION

In the framework of the invention, "a" LED network is meant to comprise "one or more" LED networks, unless otherwise mentioned.

In the framework of the invention, a non-embedded or bare LED network comprises at least non-embedded or bare LEDs and conductors which connect the LEDs electrically-conductively with each other and preferably comprises non-embedded or bare LEDs and non-encapsulated or bare conductors which connect the LEDs electrically-conductively with each other. The LED network could be a self-supporting LED network (for example on the basis of a metal grid) having a certain rigidness as a result of the configuration and the choice of the metal conductors, but it can also be a LED network printed or laminated on a support, wherein at least the conductors are applied onto the support with the aid of, for example, a conductive ink or paste, or the LED network may be applied in a support, for example, by weaving or embroidering the metal conductors in a textile, for example, a textile or a felt. The term "associated with" comprises at least all of the aforementioned embodiments.

In the framework of the invention, "insulation layer" is meant to refer to a layer which is per se at least electrically-insulating, i.e. non-conductive, and which does not comprise electrically-conductive components or surfaces.

In the framework of the invention, insulating layer "on a liquid basis" is meant to refer to an insulation layer that is formed in situ from a liquid formulation, for example, in the form of a paste, and which cures or is cured in situ, for example, under the action of light, air, heat, radiation, etc. The liquid formulation may comprise thermoplastic or non-thermoplastic materials.

In the framework of the invention, the term "embedding" is meant to refer to substantially complete covering a LED network with at least one insulation layer. In this respect, at least the conductors are substantially completely covered by said insulation layer (apart from those parts of the conductors that, for example, form the contact points for connecting to a power source). Because the LEDs have a physical height exceeding in most cases the thickness of the conductors, for example in the case of printed conductors, one or more LEDs may at their top side not entirely be covered by said one or more insulation layers. Preferably, a LED is for 90% of its height embedded into said one or more insulation layers, wherein at least its top side is not covered by said one or more insulation layers. More preferably, a LED is completely covered by said one or more insulation layers, i.e. completely closed off from the outside air. The complete encapsulation increases the resistance of the LED against mechanical and chemical influences.

The method according to the invention allows to embed an initially non-embedded LED network in a low-cost manner. A non-embedded LED network is simpler to manufacture than a LED network with encapsulated conductors and embedded LEDs, given that the bare conductors do not need to be stripped at the location of the connection with the LED. Also, the components for the manufacture of a non-embedded LED network are considerably cheaper, as a bare conductor is cheaper than an encapsulated conductor and a bare LED is cheaper than an embedded LED.

Preferably, said LED network comprises a network of conductors which provides a set of bare LEDs with energy, and which connects said set of bare LEDs in a pattern with each other.

The non-embedded LED network according to the invention may be associated with the flexible support as a continuous LED network, which extends in length over substantially the length of the flexible support, or it may be provided as a series of separate discrete LED-networks with a certain length on the flexible support. For example, a LED network has a length of 1/100 of the length of a flexible support, and the flexible support comprises 90 separate discrete LED networks. The flexible support may subsequently be cut, for example, on those places where there is no LED network present, to obtain separate LED networks. Alternatively, a continuous LED network, such as illustrated in FIG. 4, may also be cut in such a way that conductors are cut, wherein each part of the cut up network nevertheless retains its functionality.

Preferably, the method of embedding a non-embedded LED network is carried out according to a first embodiment of the invention, wherein successively:

(a1) a continuous flexible support is provided;
(b1) a first flexible insulation layer on a liquid basis is applied in a continuous way onto said continuous flexible support;
(c1) a non-embedded LED network is positioned onto said first flexible insulation layer;
(d1) a second flexible insulation layer on a liquid basis is applied in a continuous manner onto said non-embedded LED network and said first insulation layer; and
(e1) optionally, said winding, folding, cutting and/or stacking is carried out.

According to a further embodiment, after step (d1) one or more further insulation layers, for example, a third, fourth and/or fifth insulation layer on a liquid basis are applied in a continuous manner, for example on the aforementioned second insulation layer or on said continuous flexible support, i.e. on that side of said continuous flexible support which faces away of said first flexible insulation layer.

Preferably, a non-embedded LED network is placed in a continuous manner onto said first flexible insulation layer, for example via a roll-to-roll method. However, a discrete non-embedded LED network may also manually and individually be placed onto said first flexible insulation layer.

The non-embedded LED network obtained with the method according to a first embodiment of the invention is fully embedded between a first and a second insulation layer. Hence, these layers form a foil wherein the non-embedded LED network has been sandwiched. The layers, in particular the insulating layers, from which the foil is built up, have, in addition to a protective function, also an optical function, namely, the foil will influence the light that is emitted by the LEDs. This influence can be optimized by selecting properties such as thickness, colour, opacity, transparency, translucency and light refraction of the first and/or second insulation layer. Hence, an embedded LED network may be obtained wherein the foil diffuses the light into the foil such that a uniform plane-shaped light output is obtained, contrary to the point-shaped light output that the LEDs in the network themselves produce. Because the light output can be influenced, and because the foil with LEDs, in comparison with LED networks of the state of the art, have a smaller thickness, many applications may be found for embedded LED networks that have been embedded by the method according to the invention. Furthermore, the insulating layers may also have other functions, for example, as a heat sink for discharging heat and as a reflector for reflecting heat and light.

Preferably, at least one of the first or second insulation layer is a transparent insulation layer, wherein this insulation layer is transparent enough to permit the passage of visible light from the LEDs in whole or in part.

A further advantage compared to the LED networks of the prior art is that the LED networks according to the invention may be processed to a perfectly flat plane-parallel foil or textile, contrary to a laminated LED network wherein the thickness of the laminate follows the thickness of the bare network, i.e. thicker on places where there is a LED positioned, and thinner on the places between the LEDs.

Because both the first insulation layer, as well as the second insulation layer forms a continuous layer, the bare LEDs are embedded between two continuous layers and hence, completely screened from the surroundings, in particular, of air and moisture.

The support may be a permanent support, but it constitutes in practice often a temporary support, for example of paper, on which the different layers are applied. After the at least partial curing of the applied layers, the temporary support may be removed (transfer-coating method). By providing a first insulation layer on the support, placing thereon the non-embedded LED network and providing thereon a second insulation layer, a continuous method of production is provided to embed a non-embedded LED network. According to this first embodiment, mostly a non-embedded LED network may be embedded which is per se not sufficiently strong to support itself during embedding.

Preferably, the method comprises between applying the first insulation layer on a liquid basis and placing the non-embedded LED network onto the first insulation layer, the step of:

(f1) applying an adhesive layer onto said first insulation layer, wherein into or onto said adhesive layer said non-embedded LED network may be adhered.

Hence, the build-up of the embedding is: support—first insulation layer—adhesive layer/non-embedded LED network—second insulation layer, wherein the non-embedded LED network is inserted into the adhesive layer. The adhesive layer ensures a good adhesion between the non-embedded LED network and the first and second insulation layers. Also, by virtue of the adhesive layer, the possibility of air bubbles between the first and the second insulation layer will be greatly reduced.

Preferably, said applying the first insulation layer comprises the following steps:
  applying an insulation layer paste onto said support;
  spreading said insulation layer paste up to a predetermined first insulation layer thickness; and
  at least partially curing said first insulation layer paste to obtain the first insulation layer.

This method may be applied in general in order to also apply the other layers, in particular, said transparent insulation layer, said first and second insulation layer, said adhesive layer and an optional top layer.

Applying a continuous layer on a support can be done conventionally via different methods, for example via a roll-to-roll (RTR) method. The advantage of applying the layer via spreading of an applied paste is that by spreading, a flat top side of the first insulation layer is obtained. This flat top side may serve as a reference level to apply thereon the subsequent layers. Furthermore, by spreading, an unambiguous thickness of the layer can be set. By choosing this thickness, influences of optical effects, such as diffusion of the light through the layer, may be influenced, namely, a thick layer will diffuse the light more than a thin layer.

Preferably, said placing the non-embedded LED network onto said first insulation layer comprises the following steps:
  focusing the LEDs in order to emit light in the same direction; and
  pressing the LEDs in the adhesive layer until the LEDs abut against said first insulation layer.

Focussing the LEDs in one and the same direction and up to one and the same depth in the adhesive layer by pressing, has as result that the light intensity observed outside the foil is substantially constant from LED to LED in the foil. A small deviation in depth in the foil from one LED to the other LED has as a result that the one LED will be more visible from outside the foil than the other LED. This allows to obtain an evenly and uniform light output.

Preferably, the surface of said support exhibits a predetermined texture. This structure may be located on the outside of a permanent support, but may also be applied on the inside of a temporary support. By providing the temporary support on the inside of a surface with a texture, the layer subsequently placed thereon will obtain this texture, and will maintain it when the temporary support is removed. A structure will have an effect on the dispersion of the light in the foil, and on the refraction of the light when it emerges from the foil. By adapting the texture, an optical effect may be obtained.

According to a variant of the first embodiment of the method according to the invention, the method comprises after the step of applying said second insulation layer on a liquid basis the step of removing said support of said first insulation layer.

According to a second embodiment of the invention, said non-embedded LED network is applied into or onto a continuous flexible support, for example, a plastics foil, paper or a textile, and said flexible insulation layer on a liquid basis on said non-embedded LED network is applied into or onto said flexible support. In this second embodiment, the LED network is embedded via the principle of direct coating. With direct coating, a surface is directly provided with a coating. This is only possible if the surface to be coated has a sufficiently large strength. For example, a textile or foil with LEDs incorporated therein will have a tensile strength and/or folding stability that is sufficient to coat directly. Such a plastics foil, paper or textile may also be coated using transfer coating. A LED network according to the first embodiment of the invention will often have a too low tensile strength and/or folding stability, and will be coated using transfer coating, but not using direct coating.

Optionally, a second insulation layer on a liquid basis is applied onto one side of the support which is different from the side onto which said flexible insulation layer on a liquid base has been applied.

Preferably, said support comprises a plastics foil, paper or textile. By coating a textile with LED networks incorporated or applied thereon on two sides, the non-embedded LED network will be fully encapsulated and hence protected against environmental influences, such as oxygen, air, dirt, water, moisture e.a. Herein, the textile material preferably forms the continuous support onto which the insulation layers are applied.

Preferably, said continuous flexible support is a support on a role which is at least partly unwound prior to applying a first insulation layer on a liquid basis. Supplying the continuous flexible support on a roll in the process increases the continuity of the production process and hence its simplicity.

The invention will now in more detail be described on the basis of an embodiment shown in the figures. However, the invention is not limited to the embodiment shown in the figures.

In the figures:

FIG. 1 shows a side view of a device on which a method according to a first embodiment of the invention is carried out;

FIG. 2 shows a side view of a device on which a method according to a second embodiment of the invention is carried out;

In the figures the same or analogous element has been attributed the same reference numeral.

Figure 3:
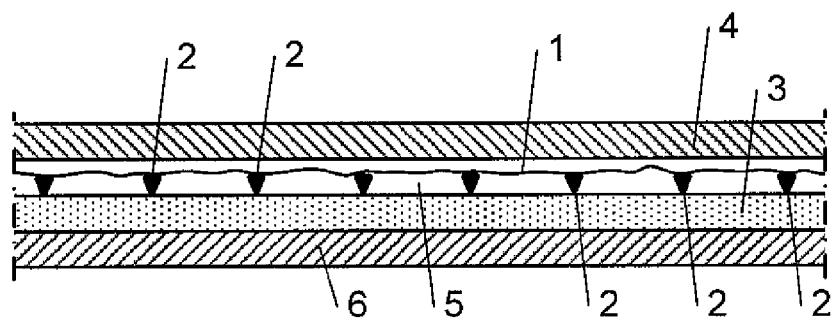
FIG. 3 shows a cross-section of a foil with embedded LED network, manufactured according to the invention.

FIG. 3 shows a non-embedded LED network 1 that is embedded according to the method of the invention. The non-embedded LED network 1 comprises conductors which connect bare LEDs 2 with each other. On the one side of the non-embedded LED network is located a first insulation layer 3, and on the other side of the non-embedded LED network is located a second insulation layer 4. The first and second insulation layer 3 and 4 may have the same or different thicknesses, and may be manufactured of the same or of different materials. Preferably, an adhesive layer 5 is provided between the first insulation layer 3 and the second insulation layer 4 to adhere the non-embedded LED network during the execution of the method according to the invention. These adhesive layer 5 may have a thickness such that the non-embedded LED network is completely enclosed by the adhesive layer 5, as shown in FIG. 3. However, the adhesive layer 5 may also have a smaller thickness than the non-embedded LED network, such that the non-embedded LED network is not completely positioned in the adhesive layer 5, but partly in the adhesive layer 5 and partly in the second insulation layer 4. FIG. 3 further shows how the different layers 3, 4 and 5, which together form a foil wherein the non-embedded LED network is embedded, are applied onto a support 6. Preferably, the support 6 is flexible and has a supporting function when embedding non-embedded LED networks according to a first embodiment of the invention. In order to embed a non-embedded LED network according to the second embodiment, which is also within the scope of the invention, no extra support layer is necessary. Further layers, such as a top layer (not displayed) can be applied in order to further influence the optical properties.

Layer thicknesses of the individual different layers comprising the coating configuration, may vary from a few tens of microns to a few centimetres, preferably of a few hundreds of microns up to several millimetres. Preferably, the total of the coating layers applied onto a support medium, is at least as thick as the thickness of the non-embedded LED network, but not much more than the thickness of the non-embedded LED network Preferably, the support is a textile, paper or a plastics foil, metal foil, or combinations of the aforementioned, which preferably form a continuous layer and, preferably, are provided on a roll (RTR method). Herewith, the support will have a supportive function when applying the different layers. The support may also comprise a non-embedded LED network, and, preferably, is embedded according to the second embodiment of the method according to the invention. Such a support is formed, for example, as a woven textile wherein conductive wires in the textile material are worked in, and on which LEDs have been applied, for example, by soldering. The support may also be formed separately of the non-embedded LED network, for example, as a paper or plastics layer, and the non-embedded LED network can be provided thereon, preferably according to the first embodiment of the method according to the invention. Preferably, the support is provided with a surface texture. A surface texture which is preferably not flat, will have an optical effect. The first insulation layer which is applied onto the support on a liquid basis, by virtue of its adhesion to the support, will essentially adopt the texture of this support (on the side facing the first insulation layer). When the light from the LEDs is emitted through this insulation layer, the refraction of the light will partly be determined by the shape (texture) of the surface of this first insulation layer.

The first and second insulation layer are applied onto the non-embedded LED network as continuous layers to embed the non-embedded LED networks and to protect them against dirt, water and moisture from the environment. These layers may be applied in various ways, including blade coating and curtain coating.

Using blade coating, the coating material is applied in a fluid/liquid form on the layer to be coated, after which the coating material is spread using a blade until a predetermined coating layer thickness is obtained. By the application of blade coating, a coating layer is obtained with a flat top surface in which differences in thickness of the layer to be coated are levelled out by the applied coating.

Using curtain coating, a coating material in fluid/liquid form is applied onto the layer to be coated such that a coating is obtained with a constant thickness. By the application of curtain coating, a coating layer is obtained having a constant thickness in which the texture of the layer to be coated is also found in the upper side of the coating layer.

Preferably, coating materials are selected from PVC derivatives, polyurethane derivatives, silicone derivatives, polyacrylates, epoxides, melamine formaldehyde, polyvinyl butyral, and polyesters. Preferably, the coating material is a silicone derivative. Combinations of the above materials are also possible. To this materials, additives can be added, selected from, among others, plasticisers, pigments, flame retardants, dyes, UV-stabilizers, thermal stabilizers, blowing agents, biocides, and optical materials.

It is particular preferred that the method according to the invention, in particular, the RTR coating process, is applicable both for thermoplastic (e.g. PVC) and non-thermoplastic, c.q. thermosetting (e.g. silicones) materials.

After the application of a coating layer via blade coating or via curtain coating, this layer is at least partially cured. Allowing the layer to cure can be done by allowing the coating material to react during a predetermined period of time. This time can typically be speeded up by adding heat and/or UV and/or an electron beam (E-beam) during the reaction.

Figure 4:
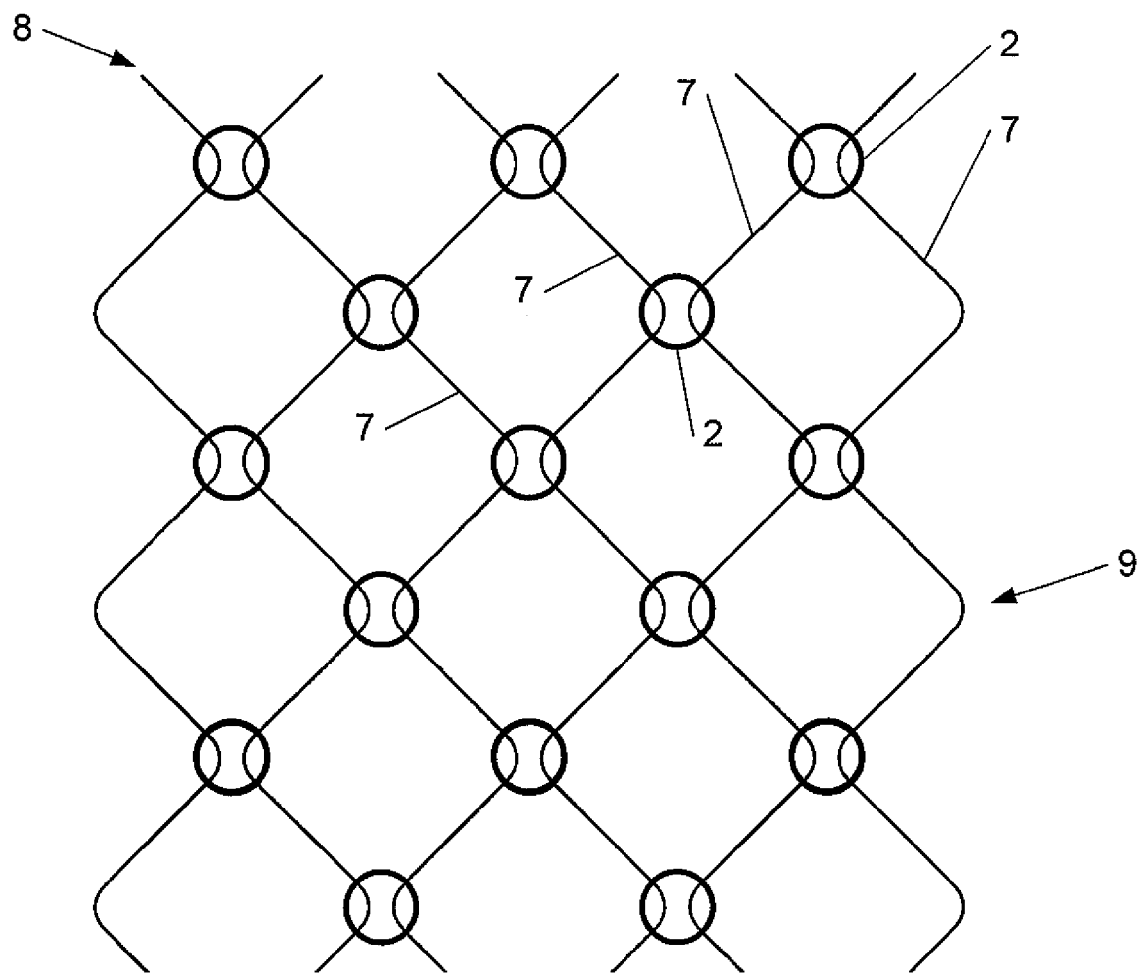
FIG. 4 shows a LED network according to a preferred embodiment of the invention.

Preferably, the LED network is formed as shown in FIG. 4. The Figure schematically shows the LEDs 2 which are connected to each other via conductors 7. The conductors 7 extend parallel to each other wherein the LEDs constitute the connection between adjacent parallel conductors 7. The parallel conductors 7 may be pulled apart, as a result of which the conductors 7 do not extend in a straight way but in an undulating way. A LED network, as shown in FIG. 4, may be provided with a voltage by connecting it to a voltage source on the one hand at reference numeral 8, and on the other hand at reference numeral 9. Because of this, because between each adjacent conductor the same number of LEDs are present, each conductor will be at a different potential. Hence, one of the end conductors 8 or 9 will have a low potential and the other end conductor 8 or 9 will have a high potential, and each intermediate conductor will have a respective intermediate potential. Because of its above-described layout, such a LED network may be cut up in discrete functional parts, wherein each part still retains the function of the LED network. When cutting up, preferably the direction of the conductors is taken into account, and preferably cutting is done parallel to this direction and at right angles to this direction, and preferably not diagonally.

The application of such a LED network to be cut up, in a continuous process of embedding has the advantage that a process of continuous embedding can be optimized, wherein the LED network, after embedding, is cut to the desired dimensions.

The method according to a first embodiment of the invention is illustrated in FIGS. 1 and 2 wherein FIG. 2 is a preferred embodiment of this first embodiment. In this first embodiment, the non-embedded LED network is embedded using the principle of transfer coating. Using transfer coating, a support is provided which is not directly linked with the product to be obtained. On this support, the different layers are applied, after which this support is removed.

FIG. 1 shows a support 6 on a roll that is unwound (in the figure from left to right). On this support 6, a first insulation layer 3 is applied via blade coating. To this end, on the support a first coating material 10 is applied which is spread with the first blade 11 in order to obtain the first insulation layer 3. This first insulation layer 3 is allowed to at least partly cure, in the figure indicated with reference numeral 12. This first insulation layer 3 forms a continuous band. The same continuous band may be obtained by applying the first insulation layer in a different way than described above.

On the first insulation layer 3, a non-embedded LED network is placed. Because of this, the non-embedded LED network at the bottom side (the side of the first insulation layer 3), is protected from the environment. Preferably, the non-embedded LED network is fed using a roll 13. Preferably, the LEDs are all oriented to point into the same direction to obtain an uniform light output.

One or more non-embedded LED networks may be placed on the first insulation layer 3 using one or more rollers 13. These non-embedded LED networks are located, for example, adjacent to or behind each other in parallel bands on the first insulation layer 3.

On top of the LEDs, a further second insulation layer 4 is applied. In this way, the non-embedded LED network is protected from the environment on its upper side (the side of the second insulation layer 4). This second insulation layer 4 is obtained by applying a second coating material 14 onto the non-embedded LED network and the first insulation layer, which is spread with the second blade 15 to obtain the second insulation layer 4. This second insulation layer 4 is at least partly left to harden, in the Figure shown with reference numeral 16. This second insulation layer 4 forms a continuous band across the non-embedded LED network and the first insulation layer 3. The same continuous band may be obtained by applying the second insulation layer in a different manner than described above.

Hereinafter, the whole of a first insulation layer, non-embedded LED network, and second-insulation layer is wound up on an reel 17. Winding on a reel 17 is only possible because the layers are formed as a continuous band. When a LED network, as shown in FIG. 4, is used in the method, the reel may be further cut up to obtain foils with LEDs.

According to a non-illustrated embodiment, the reel 17 is replaced by a cutting device, wherein the whole of first insulation layer, non-embedded LED network, and second-insulation layer is fed through a roller apparatus up to the cutting device to be cut up and stacked.

In FIG. 2, optionally an extra layer is added between the first insulation layer 3 and the non-embedded LED network. This extra layer forms an adhesive layer 5 in which the LEDs can be pressed when carrying out the method. For forming this first adhesive layer an adhesive material 18 is applied onto the first insulation layer, which is subsequently spread with a blade 19 up to a predetermined thickness. An important difference with the first and second insulation layer is that the adhesive layer is only cured after the LEDs are placed in the adhesive layer, as is indicated in FIG. 2 with reference numeral 20. Because of this, the non-embedded LED network is placed into the yet uncured adhesive layer, which facilitates positioning of the LEDs.

The coating conditions are depending of the coating material used. It is intended that the coating is dry after the drying step. The drying of the wet coating layer may be done both thermally (at room temperature or higher) as well as by means of UV-curing. An example is the coating with a PVC-plastisol. After coating by means of a blade, the coating formulation is typically dried for 1 minute at 180° C.

Furthermore, it is particularly preferred that the method according to the invention, in particular the RTR coating process, is a pressure-free process, which does not cause harm to the LEDs.

In addition to focusing the LEDs, the depth at which the LEDs are located with respect to the bottom side and/or top side of the foil will be decisive for the intensity of the light emitted by the LED out of the foil. To this end, the LEDs are pressed with a constant force in the adhesive layer 5 when placing the LEDs in the adhesive layer. Preferably, the LEDs are pressed up to the bottom side in the bonding layer such that they abut the at least partly cured first insulation layer and thus are positioned on the same depth in the foil, because the thickness of this first insulation layer is constant.

In FIG. 2 is displayed how, after application of all layers, and just before winding the whole comprising the first insulation layer, the optional adhesive layer, the non-embedded LED network, and the second insulation layer, the support is removed from the first insulation layer. This support is removed after the application of the second insulation layer. "Removing the support" shall be understood as comprising the removal of the support after winding, and unwinding the whole comprising the first insulation layer, the optional adhesive layer, the non-embedded LED network, and the second insulation layer, wherein the support is part of the reel resulting from the method according to the invention, but not of the final end product.

The LEDs that may be embedded by the application of the invention are low power LEDs, medium power LEDs, high power LEDs or combinations thereof. In addition, LEDs may be embedded that emit light from one side, or LEDs that emit light from several sides. LEDs that can be embedded are, among others, white LEDs, coloured LEDs, and RGB LEDs. Preferably, the LEDs that are embedded by the application of the invention, are bare LEDs (not yet embedded LEDs). Preferably, these LEDs have a thickness smaller than 3 mm, more preferably a thickness smaller than 2 mm, most preferably a thickness smaller than 1 mm.

The LEDs can be connected with conductors as shown in FIG. 4, so as to obtain a diamond-shaped network of conductors. The LEDs may also be provided on a textile or foil, which textile or foil acts as a support for the LEDs.

Further layers may be provided to the product that originates from the method, such as a reflective coating in order to reflect the light that is emitted from the foil to one side such that light is only emitted from this one side of the foil. In this way the light output from the foil is maximized. This reflective layer can be formed by a.o. a metallic layer that is applied as a top layer or bottom layer.

To the insulation layers, additives may be added in order to improve the optical properties. For example, glass spheres, preferably hollow glass spheres, or titanium dioxide may be added, wherein these additives have shapes and dimensions that bring about the desired effects.

The invention also relates to the embedded LED network, or a functional part thereof, in particular the embedded LED network obtained with the method according to the invention, in particular a LED network associated with a flexible support and provided with a continuous flexible insulation layer on a liquid basis applied on said non-embedded LED network, associated with said flexible support, obtained by carrying out the method according to the invention.

In particular, the invention also relates to an embedded LED network, associated with a flexible support, and provided with a continuous flexible insulation layer on a liquid basis on the basis of a non-thermoplastic material, in particular a silicone derivative, applied to said LED network associated with said flexible support.

A product comprising the embedded LED network according to the invention has many applications including indoor and outdoor lighting and both functional and decorative lighting. To this end, the invention also comprises a lighting unit comprising an embedded LED network according to the invention, in particular an embedded LED network, associated with a flexible support, and provided with a continuous flexible insulation layer on a liquid basis, on the basis of a non-thermoplastic material, in particular, a silicone derivative, applied to said LED network, associated with said flexible support.

EXAMPLES

On a transfer paper, using a roll-to-roll (RTR) coating process (i.e., transfer coating), a PVC plastisol layer of 300 microns was applied. This layer was dried for 1 min at 180° C. Subsequently, a second PVC plastisol layer of 300 micron was applied. In this wet layer, the LED network was placed, after which it was dried for 1 min at 180° C. Finally, a third PVC plastisol layer of 1500 microns was applied and dried for 1 min at 180° C. In this manner, a completely embedded LED network is obtained using a RTR-coating process.

Comparative Example

Also, experiments were carried out wherein the LED network, by means of lamination, was embedded between 2 polymeric foils according to the method of DE 10 2007 039 416 A1. However, this presented major problems:

Always, a certain temperature is required, (typical of 170° C. for 1 minute in the case of PVC-foils) in combination with a certain pressure. As a result of this combination, the LEDs may break and/or the solder may melt. It is also very difficult to remove all the air without making use of a vacuum. In the case of a (non-thermoplastic) silicone foil, a wet silicone intermediate layer and a high drying temperature should be used to allow both of the silicone foils to bond to each other. Also here, an amount of air was enclosed. In short, the method according to the invention, in particular, the aforementioned RTR coating process has large advantages compared to a lamination process.

Finally, the following aspects of the invention are also described:

Aspect 1. Method for embedding of one or more LED networks, containing the steps:
providing said LED networks;
bonding a first insulation layer to said LED networks, such that the LED networks are covered on one side;
applying a continuous second insulation layer on said LED networks which are attached to said first insulation layer, which second insulation layer extends as a continuous band over said LED networks and which covers the LED networks on another side than said first side; and
winding said first insulation layer with said LED networks and said continuous second insulation layer.

Aspect 2. Method according to aspect 1, wherein said first insulation layer is continuously applied and is forming a continuous band that extends along said first side.

Aspect 3. Method according to any one of the preceding aspects, wherein said LED network comprises a network of conductors which provide a set of LEDs with energy and which connect said set of LEDs in a pattern with each other.

Aspect 4. Method according to any one of the preceding aspects, wherein sequentially:
a support is provided;
said first insulation layer is applied onto said support;
said one or more LED networks is placed onto said first insulation layer;
said second insulation layer is applied over said LED networks and said first insulation layer; and
said winding is performed.

Aspect 5. Method according to aspect 4, wherein the method between the application of the first insulation layer and placing the LED networks on the first insulation layer contains the following step: applying an adhesive layer on said first insulation layer, in or on which adhesive layer said LED networks can be adhered.

Aspect 6. Method according to aspect 4 or 5, wherein said application of the first insulation layer contains the following steps:
applying an insulation layer paste on said support;
spreading said insulation layer paste up to a predetermined first insulation layer thickness; and
at least partly curing said first insulation layer paste to obtain the first insulation layer.

Aspect 7. Method according to any one of the aspects 4 to 6, wherein said placing the LED network on said first insulation layer comprises the following steps:
focusing the LEDs in order to emit light in the same direction; and
pressing the LEDs against said first insulation layer.

Aspect 8. Method according to any one of the aspects 4 to 7, wherein said support is a flexible support.

Aspect 9. Method according to any one of the aspects 4 to 8, wherein said support has a surface which exhibits a predetermined texture.

Aspect 10. Method according to any one of the aspects 4 to 9, wherein after the step of applying said second insulation layer, the method comprising the step of removing said support of said first insulation layer.

Aspect 11. Method according to any one of the aspects 1 to 3, wherein said LED networks are applied on a continuous support, and wherein said first insulation layer and second insulation layer are each applied onto a different side of said continuous support.

Aspect 12. Method according to aspect 11, wherein said continuous support is a support on a roll which is at least partly unwound prior to applying the first insulation layer and the second insulation layer.

Aspect 13. Method according to aspect 11 or 12, wherein said support comprises a textile.

Aspect 14. Lighting unit containing embedded LEDs obtained by carrying out the method according to any one of the aspects 1 to 13.

The invention claimed is:

1. A method for embedding a non-embedded LED network comprising the steps of:
   (a) providing a non-embedded LED network fixed into or onto a continuous flexible textile; and
   (b) embedding the non-embedded LED network fixed into or onto a continuous flexible textile to produce a flexible, plane-parallel textile by applying in a continuous manner at least one flexible insulation layer on a liquid basis onto said non-embedded LED network which is fixed into or onto said continuous flexible textile.

2. The method according to claim 1, which comprises the step of winding, folding, cutting and/or stacking the product that is at least obtained with the steps (a) and (b).

3. The method according to claim 1, wherein said non-embedded LED network comprises a network of conductors which provides a set of bare LEDs with energy, and which connects said set of bare LEDs in a pattern with each other.

4. The method according to claim 1, wherein successively:
(a1) a continuous flexible support is provided;
(b1) a first flexible insulation layer on a liquid basis is applied in a continuous manner onto said continuous flexible support;
(c1) said non-embedded LED network fixed into or onto a continuous flexible textile is positioned onto said first flexible insulation layer;
(d1) a second flexible insulation layer on a liquid basis is applied in a continuous manner onto said non-embedded LED network and said first insulation layer; and
(e1) optionally, said winding, folding, cutting and/or stacking is carried out.

5. The method according to claim 4, wherein the method between applying the first insulation layer on a liquid basis and placing the non-embedded LED network onto the first insulation layer comprises the step of:
(f1) applying an adhesive layer onto said first insulation layer, wherein into or onto said adhesive layer said non-embedded LED network may be adhered.

6. The method according to claim 4, wherein said applying the first insulation layer comprises the following steps:
applying an insulation layer paste onto said support;
spreading said insulation layer paste up to a predetermined first insulation layer thickness; and
at least partially curing said first insulation layer paste to obtain the first insulation layer.

7. The method according to claim 5, wherein said placing the non-embedded LED network onto said first insulation layer comprises the following steps:
focusing the LEDs in order to emit light in the same direction; and
pressing the LEDs in the adhesive layer until the LEDs abut against said first insulation layer.

8. The method according to claim 4, wherein said continuous flexible support has a surface which exhibits a predetermined texture.

9. The method according to claim 4, wherein after the step of applying said second insulation layer on a liquid basis the method comprises the step of removing said support of said first insulation layer.

10. The method according to claim 1, wherein a second insulation layer on a liquid basis is applied onto one side of the support which is different from the side onto which said flexible insulation layer on a liquid basis has been applied.

11. The method according to claim 1, wherein said continuous flexible textile is a textile on a roll which is at least partly unwound prior to applying said insulation layer on a liquid basis.

12. The method according to claim 4, wherein said continuous flexible support comprises a plastics foil or a paper.

13. An embedded LED network, obtained with the method according to claim 1, or a functional part of it.

14. An embedded LED network associated with a flexible textile and provided with a continuous flexible insulation layer on a liquid basis based on a non-thermoplastic material applied onto said LED network associated with said flexible textile.

15. A lighting unit comprising an embedded LED network according to claim 13.

16. A lighting unit comprising an embedded LED network according to claim 14.

17. An embedded LED network according to claim 14, wherein said non-thermoplastic material is a silicone derivative.

18. A lighting unit comprising an embedded LED network according to claim 17.

* * * * *